(12) United States Patent
Hara et al.

(10) Patent No.: US 7,664,202 B2
(45) Date of Patent: Feb. 16, 2010

(54) TRANSMISSION DEVICE AND WIRELESS COMMUNICATION APPARATUS

(75) Inventors: Yoshihiro Hara, Osaka (JP); Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 616 days.

(21) Appl. No.: 11/547,354

(22) PCT Filed: Feb. 2, 2006

(86) PCT No.: PCT/JP2006/001775

§ 371 (c)(1),
(2), (4) Date: Sep. 29, 2006

(87) PCT Pub. No.: WO2006/082894

PCT Pub. Date: Aug. 10, 2006

(65) Prior Publication Data

US 2007/0211820 A1    Sep. 13, 2007

(30) Foreign Application Priority Data

Feb. 3, 2005    (JP)    ............................. 2005-027562

(51) Int. Cl.
H04L 25/49    (2006.01)
(52) U.S. Cl. .................................. 375/297; 455/127.2
(58) Field of Classification Search ................. 375/300, 375/302, 297; 455/108, 110, 127.1, 127.2, 455/127.5, 93, 102; 330/51, 296, 273, 127, 330/199, 200, 259, 290; 323/266
See application file for complete search history.

(56) References Cited

U.S. PATENT DOCUMENTS 5,530,923 A * 6/1996 Heinonen et al. ........... 455/126
5,909,643 A * 6/1999 Aihara ..................... 455/127.3
6,107,878 A * 8/2000 Black ......................... 330/129
6,169,449 B1 * 1/2001 Hasegawa ..................... 330/51

(Continued)

FOREIGN PATENT DOCUMENTS

EP    1 450 479    8/2004

(Continued)

OTHER PUBLICATIONS

Supplementary European Search Report dated Jun. 10, 2009 for European Application No. 06 71 2918.

Primary Examiner—Chieh M Fan
Assistant Examiner—Aristocratis Fotakis
(74) Attorney, Agent, or Firm—Wenderoth, Lind & Ponack, L.L.P.

(57) ABSTRACT

In a first mode in which the power level of a transmission output signal (S6) is to be high, an output from the multiplier (2) is input to an amplitude modulation signal amplifier (4), and a radio frequency power amplifier (5) performs amplitude modulation on a radio frequency phase modulated signal (S4) using a nonlinear area with a supply voltage from the amplitude modulation signal amplifier (4). In a second mode in which the power level of a transmission output signal (S6) is to be low, the output from the multiplier (2) is input to a variable gain amplifier (7), and the variable gain amplifier (7) performs amplitude modulation on the radio frequency phase modulated signal (S4). The amplitude modulated signal is output without passing through the radio frequency power amplifier (5).

16 Claims, 10 Drawing Sheets

U.S. PATENT DOCUMENTS

| | | | |
|---|---|---|---|
| 6,191,653 B1 | 2/2001 | Camp, Jr. et al. | |
| 6,529,716 B1 | 3/2003 | Eidson et al. | |
| 6,650,878 B1 * | 11/2003 | Abe et al. | 455/232.1 |
| 7,050,772 B2 * | 5/2006 | Herzberg et al. | 455/191.3 |
| 2002/0177420 A1 | 11/2002 | Sander et al. | |
| 2004/0071225 A1 | 4/2004 | Suzuki et al. | |
| 2004/0185803 A1 | 9/2004 | Tanabe et al. | |
| 2004/0263245 A1 | 12/2004 | Winter et al. | |
| 2004/0266366 A1 * | 12/2004 | Robinson et al. | 455/91 |
| 2005/0008093 A1 | 1/2005 | Matsuura et al. | |
| 2005/0048935 A1 | 3/2005 | Sander et al. | |
| 2006/0009169 A1 | 1/2006 | Arayashiki | |
| 2006/0052068 A1 | 3/2006 | Sander et al. | |
| 2006/0063496 A1 | 3/2006 | Sander et al. | |
| 2006/0126754 A1 * | 6/2006 | Filimonov et al. | 375/296 |
| 2007/0280374 A1 | 12/2007 | Matsuura et al. | |

FOREIGN PATENT DOCUMENTS

| | | |
|---|---|---|
| EP | 1 598 943 | 11/2005 |
| JP | 2001-156554 | 6/2001 |
| JP | 3207153 | 7/2001 |
| JP | 2004-104194 | 4/2004 |
| JP | 2004-289812 | 10/2004 |
| JP | 2005-20693 | 1/2005 |
| WO | 02/084864 | 10/2002 |

* cited by examiner

| OPERATION MODE | FIRST MODE | SECOND MODE | THIRD MODE |
|---|---|---|---|
| OUTPUT POWER | HIGH | LOW | MEDIUM |
| FIRST SWITCHING SECTION 3 | b | a | a |
| SECOND SWITCHING SECTION 8 | b | a | a |
| THIRD AND FOURTH SWITCHING SECTIONS 9 AND 14 | a | b | a |

TRANSMISSION DEVICE AND WIRELESS COMMUNICATION APPARATUS

TECHNICAL FIELD

The present invention relates to a transmission device for amplifying the power of a transmission signal and outputting the transmission signal, and a wireless communication apparatus using the same.

BACKGROUND ART

Conventionally, as radio frequency power amplifiers for amplifying a modulation signal including an envelope fluctuation component, class A or class AB linear amplifiers have been used in order to linearly amplify the envelope fluctuation component. Such class A and class AB linear amplifiers provide a high linearity, but constantly consume power which accompanies a DC bias component and so have a lower power efficiency than, for example, class C, D or E nonlinear amplifiers. This brings about a drawback that when such a radio frequency power amplifier having a high power consumption is used in a mobile wireless apparatus having a battery as a power source, the battery life is short. When such a radio frequency power amplifier is used for a base station apparatus of a wireless system including a plurality of high power transmission apparatuses, the scale of the base station apparatus is enlarged and the amount of heat generation is increased.

In light of the circumstances, methods for improving the power efficiency using polar modulation have been conventionally proposed. FIG. 11 is a block diagram showing a structure of a conventional transmission device using a polar modulation system. As shown in FIG. 11, the conventional transmission device includes an amplitude/phase separation section 61, an amplitude modulation signal amplifier 62, a frequency synthesizer 63, and a radio frequency power amplifier 64 as a nonlinear amplifier.

The amplitude/phase separation section 61 separates an input baseband modulation signal S10 into a baseband amplitude modulation signal S11 and a baseband phase modulation signal S12. The amplitude modulation signal amplifier 62 performs predetermined amplification on the baseband amplitude modulation signal S11, and then supplies the resultant signal to the radio frequency power amplifier 64 as a supply voltage. The frequency synthesizer 63 performs phase modulation on a carrier wave signal with the baseband phase modulation signal S12 to obtain a radio frequency phase modulated signal S13, and transmits the radio frequency phase modulated signal S13 to the radio frequency power amplifier 64. Thus, the radio frequency power amplifier 64 amplifies the radio frequency phase modulated signal S13 under the supply voltage in accordance with the baseband amplitude modulation signal S11, and outputs the resultant signal as a transmission output signal S14.

Now, an operation of the transmission device using the polar modulation system will be described. Where the baseband modulation signal S10 is Si (t), Si (t) is represented by expression (1). Here, a(t) represents amplitude data, and exp[jϕ(t)] represents phase data.

$$Si(t) = a(t) \exp[j\phi(t)] \quad (1)$$

The amplitude/phase separation section 61 extracts amplitude data a(t) and phase data exp[jϕ(t)] from Si(t). The amplitude data a(t) corresponds to the baseband amplitude modulation signal S11, and the phase data [jϕ(t)] corresponds to the baseband phase modulation signal S12. The amplitude data a(t) is amplified by the amplitude modulation signal amplifier 62 and is supplied to the radio frequency power amplifier 64. Thus, the value of the supply voltage of the radio frequency power amplifier 64 is set based on the amplitude data a(t).

The frequency synthesizer 63 generates the radio frequency phase modulated signal S13 by modulating carrier wave angular frequency ωc with the phase data exp[jϕ(t)], and inputs the radio frequency phase modulated signal S13 to the radio frequency power amplifier 64. Where the radio frequency phase modulated signal S13 is signal Sc, signal Sc is represented by expression (2).

$$Sc = \exp[\omega ct + \phi(t)] \quad (2)$$

Since the radio frequency power amplifier 64 is a nonlinear amplifier, the supply voltage value a(t) of the radio frequency power amplifier 64 is multiplied by the output signal from the frequency synthesizer 63, and the resultant signal is amplified by gain G to generate the transmission output signal S14. The transmission output signal S14 is output from the radio frequency power amplifier 64. Where the transmission output signal S14 is RF signal Srf, RF signal Srf is represented by the expression (3).

$$Srf = Ga(t)Sc = Ga(t) \exp[\omega ct + \phi(t)] \quad (3)$$

The signal which is input to the radio frequency power amplifier 64 is a phase modulated signal which has no fluctuation component in the amplitude direction and so is a constant envelope signal. This allows a highly efficient nonlinear amplifier to be used as the radio frequency power amplifier 64, and therefore a highly efficient transmission device can be provided. The technologies using this type of polar modulation system are described in, for example, patent document 1 and patent document 2.

Patent document 1: Japanese Patent No. 3207153
Patent document 2: Japanese Laid-Open Patent Publication No. 2001-156554
Patent document 3: U.S. Pat. No. 6,191,653

DISCLOSURE OF THE INVENTION

Problems to be Solved by the Invention

The above-described conventional transmission device using the polar modulation system uses the radio frequency power amplifier 64 as a nonlinear amplifier in an output saturation state in accordance with the supply voltage. Therefore, an input level to the radio frequency power amplifier 64 needs to be high to some extent. However, when the input level is raised, there are problems that it becomes difficult to obtain a transmission output signal, especially a signal of a low output level, due to the power leaking from the input to the output of the radio frequency power amplifier 64, operation limit of the transistor at a low supply voltage and the like.

Therefore, an object of the present invention is to provide a transmission device capable of controlling a wide range of transmission output level from a low output level to a high output level with a high power efficiency, and a wireless communication apparatus using such a transmission device.

Solution to the Problems

The present invention is directed to a transmission device using polar modulation, and a wireless communication apparatus for transmitting a transmission signal from an antenna. In order to attain the above-described object, a transmission device according to the present invention comprises an amplitude/phase separation section, a frequency synthesizer, a multiplier, first through fourth switching sections, an amplitude modulation signal amplifier, a variable gain amplifier, and a radio frequency power amplifier. A wireless communication apparatus according to the present invention comprises the above-described transmission device, wherein a transmission signal is processed with power amplification and is output to the antenna.

The amplitude/phase separation section separates an input baseband modulation signal into a baseband amplitude modulation signal and a baseband phase modulation signal. The frequency synthesizer performs phase modulation on a radio frequency carrier signal with the baseband phase modulation signal to generate a radio frequency phase modulated signal. The multiplier multiplies the baseband amplitude modulation signal by a predetermined value. The first switching section and a second switching section allow the baseband amplitude modulation signal, obtained as a result of the multiplication and output from the multiplier, and a predetermined DC voltage signal to be input thereto, and select and output one of the signals. The amplitude modulation signal amplifier supplies a supply voltage based on the signal which is output from the first switching section. The variable gain amplifier amplifies the radio frequency phase modulated signal generated by the frequency synthesizer in accordance with the signal which is output from the second switching section. The radio frequency power amplifier performs power amplification on the radio frequency phase modulated signal amplified by the variable gain amplifier, using the supply voltage supplied from the amplitude modulation signal amplifier. The third switching section and a fourth switching section, respectively provided before and after the radio frequency power amplifier, select either to output the radio frequency phase modulated signal amplified by the variable gain amplifier via the radio frequency power amplifier or to output the radio frequency phase modulated signal without using the radio frequency power amplifier. Using such a structure, the switching operation of the first through fourth switching sections is controlled in accordance with a power level of a signal which is to be output from the fourth switching section.

Typically, in a first mode in which the power level of the signal which is output from the fourth switching section is to be higher than a first predetermined value, the first switching section selects the multiplied baseband amplitude modulation signal, the second switching section selects the DC voltage signal, and the third and fourth switching sections select a path for outputting the radio frequency phase modulated signal via the radio frequency power amplifier. In a second mode in which the power level of the signal which is output from the fourth switching section is to be lower than a second predetermined value, the first switching section selects the DC voltage signal, the second switching section selects the multiplied baseband amplitude modulation signal, and the third and fourth switching sections select a path for outputting the radio frequency phase modulated signal without using the radio frequency power amplifier.

Preferably, in a third mode in which the power level of the signal which is output from the fourth switching section is to be equal to or lower than the first predetermined value and equal to or higher than the second predetermined value, the first switching section selects the DC voltage signal, the second switching section selects the multiplied baseband amplitude modulation signal, and the third and fourth switching sections select a path for outputting the radio frequency phase modulated signal via the radio frequency power amplifier.

The above-described variable gain amplifier may comprise an amplifier for amplifying the radio frequency phase modulated signal generated by the frequency synthesizer; and a multiplier for multiplying the radio frequency phase modulated signal amplified by the amplifier, by the signal which is output from the second switching section.

The transmission device may further comprise a phase correction section and an amplitude correction section for storing, for each of the first through third modes, phase correction information and amplitude correction information, for continuously changing a signal phase and a signal amplitude at the time of mode switching. In this case, the frequency synthesizer may correct the phase of the radio frequency phase modulated signal based on the phase correction information; and the variable gain amplifier may correct the amplitude of the radio frequency phase modulated signal based on the amplitude correction information.

The mode switching may be performed with hysteresis.

An attenuator may be inserted on a path, provided by the third and fourth switching sections, for outputting the radio frequency phase modulated signal without using the radio frequency power amplifier.

Effect of the Invention

A transmission device according to the present invention selects the optimum operation mode from a plurality of operation modes in accordance with the output power level of the radio frequency power amplifier, and optimally controls the leak from the input to the output of the radio frequency power amplifier. Thus, the power amplification can be performed with a high power efficiency and a high linearity, and the transmission output power can be controlled in a wide range from a high level to a low level. In addition, the discontinuous change in the amplitude and the phase of the output signal which accompanies the switching of the operation mode is prevented, and thus the amplitude and the phase are changed continuously. Therefore, problems including transitional spectrum expansion accompanying the switching can be suppressed.

BRIEF DESCRIPTION OF THE DRAWINGS

FIG. 1 is a block diagram showing a schematic structure of a transmission device according to a first embodiment of the present invention.

FIG. 2 shows operation modes switchable by the transmission device according to the present invention.

FIG. 3 illustrates a circuit configuration of a radio frequency power amplifier 5 used as a nonlinear amplifier.

FIG. 4 illustrates an operation of the radio frequency power amplifier 5 used as a nonlinear amplifier.

FIG. 5 is a block diagram showing a schematic structure of a transmission device according to a second embodiment of the present invention.

FIG. 6 is a flowchart illustrating a method by which the transmission device according to the second embodiment switches the operation mode in FIG. 2.

FIG. 7 shows a hysteresis characteristic when the transmission device according to the second embodiment switches the operation mode in FIG. 2.

FIG. 8A illustrates a continuous change in the amplitude of the transmission output signal by the transmission device according to the present invention.

FIG. 8B illustrates a continuous change in the phase of the transmission output signal by the transmission device according to the present invention.

FIG. 9A is a block diagram showing another schematic structure based on the transmission device according to the second embodiment of the present invention.

FIG. 9B is a block diagram showing still another schematic structure based on the transmission device according to the second embodiment of the present invention.

FIG. 10 is a block diagram showing a wireless communication apparatus including the transmission device according to the present invention.

FIG. 11 is a block diagram showing a schematic structure of a conventional transmission device.

Figure 1:
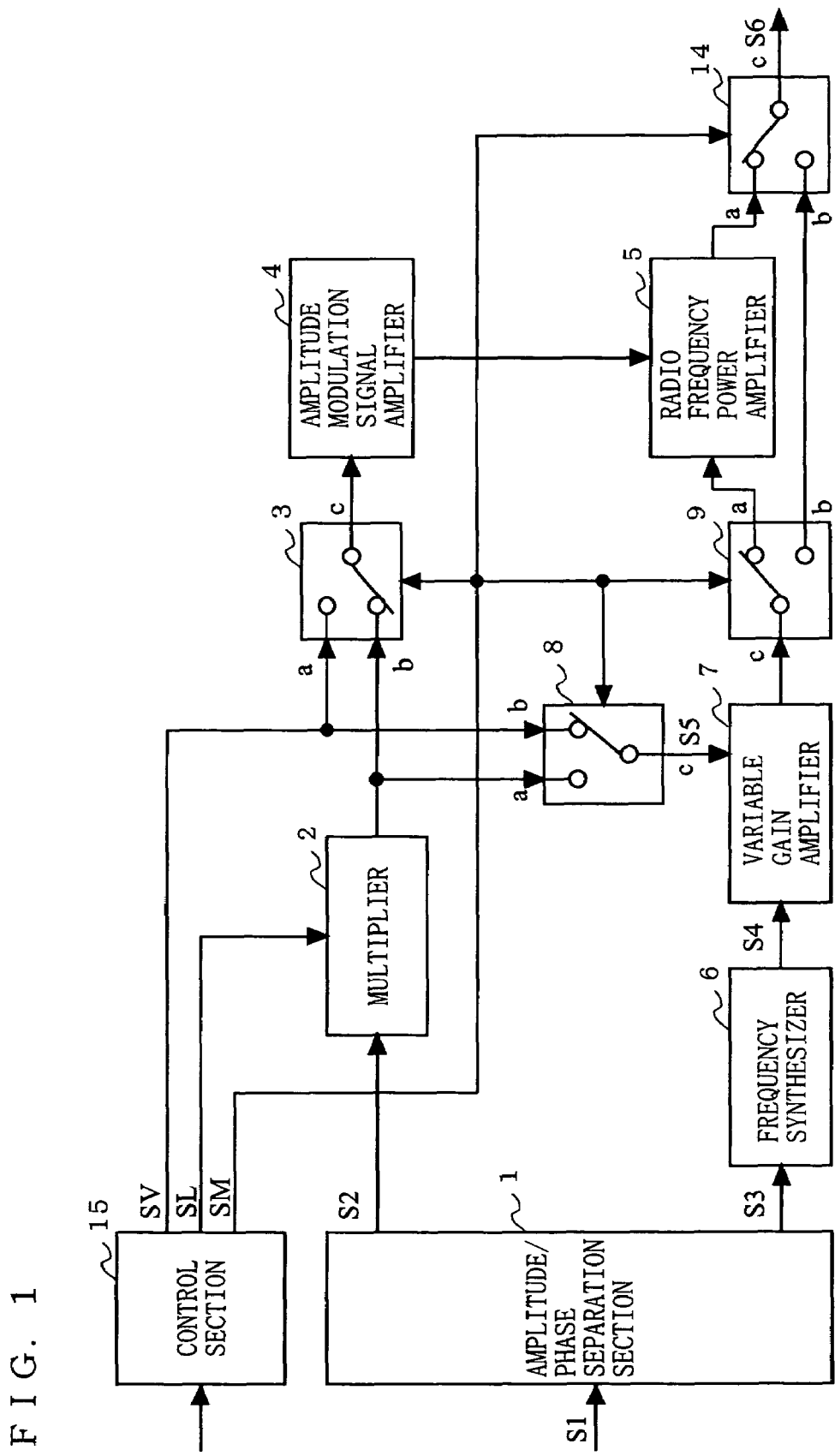
[FIG. 1]

DESCRIPTION OF THE REFERENCE CHARACTERS 1, 61 Amplitude/phase separation section
2, 17 Multiplier
3, 8, 9, 14 Switching section
4, 62 Amplitude modulation signal amplifier
5, 64 Radio frequency power amplifier
6, 63 Frequency synthesizer
7 Variable gain amplifier
11 Phase correction section
12 Amplitude correction section
15 Control section
16 Amplifier
20 Wireless communication apparatus
21 Transmission device
22 Receiving device
23 Transmission/receiving switching section
24 Antenna
50 Nonlinear amplifier
51 Parasitic capacitance

BEST MODE FOR CARRYING OUT THE INVENTION

First Embodiment

FIG. 1 is a block diagram showing a schematic structure of a transmission device using a polar modulation system according to a first embodiment of the present invention. As shown in FIG. 1, the transmission device according to the first embodiment includes an amplitude/phase separation section 1, a multiplier 2, an amplitude modulation signal amplifier 4, a radio frequency power amplifier 5, a frequency synthesizer 6, a variable gain amplifier 7, a control section 15, and first through fourth switching sections 3, 8, 9 and 14.

The amplitude/phase separation section 1 separates an input baseband modulation signal S1 into a baseband amplitude modulation signal S2 and a baseband phase modulation signal S3. The multiplier 2 multiplies the baseband amplitude modulation signal S2 by an average output level specifying signal SL supplied from the control section 15. The first switching section 3 selects either an output signal from the multiplier 2 or an DC voltage signal SV from the control section 15 based on a mode switching signal SM given from the control section 15, and outputs the selected signal to the amplitude modulation signal amplifier 4. The amplitude modulation signal amplifier 4 supplies a supply voltage, in accordance with the signal selected by the first switching section 3, to the radio frequency power amplifier 5. The frequency synthesizer 6 performs phase modulation on a carrier wave signal with the baseband phase modulation signal S3 to generate a radio frequency phase modulated signal S4. The second switching section 8 selects either the output signal from the multiplier 2 or the DC voltage signal SV from the control section 15 based on the mode switching signal SM, and outputs the selected signal to the variable gain amplifier 7 as a gain control signal S5. The variable gain amplifier 7 controls the gain of the radio frequency phase modulated signal S4 generated by the frequency synthesizer 6, in accordance with the gain control signal S5 which is output from the second switching section 8. The radio frequency power amplifier 5 amplifier the power of a signal which is input from the variable gain amplifier 7 in accordance with the supply voltage given from the amplitude modulation signal amplifier 4, and outputs the obtained signal as a transmission output signal S6. The third and fourth switching sections 9 and 14 select, based on the mode switching signal SM, either to input the output signal from the variable gain amplifier 7 to the radio frequency power amplifier 5 or to let the signal pass to be output without inputting the signal to the radio frequency power amplifier 5. The fourth switching section 14 may be of any form as long as having a switching function. For example, the fourth switching section 14 may be an FET switch, a diode switch, or a transmission path having a high impedance as seen from the branching point.

The control section 15 determines the operation mode of the radio frequency power amplifier 5 and controls the connection states such that the transmission device has a circuit corresponding to the determined operation mode. The operation mode is determined by a transmission power level, which is based on a receiving signal state specified by the wireless base station or a receiving signal state in the transmission device, and by the characteristics of the radio frequency power amplifier 5. Typically, from the viewpoint of the power efficiency, when the power level of the transmission output signal S6 is to be high, an operation mode in which the radio frequency power amplifier 5 operates as a nonlinear amplifier is desirable. When the power level of the transmission output signal S6 is to be low (outside the range in which the radio frequency power amplifier 5 is operable as a nonlinear amplifier), an operation mode in which the radio frequency power amplifier 5 operates as a linear amplifier is desirable. A signal for switching the operation mode is the mode switching signal SM. For example, a 2-bit mode switching signal may be used to output "01" when the transmission power level is to be high and to output "10" when the transmission power level is to be low. The average output level specifying signal SL is for specifying an average power level of the signals which are output from the transmission device. The DC voltage signal SV is a fixed voltage for controlling the gain of the amplitude modulation signal amplifier 4 and the variable gain amplifier 7. The control section 15 may be provided either in the transmission device or outside the transmission device.

Hereinafter, an operation of the transmission device having the above-described structure according to the first embodiment will be described. In the following example, the transmission device is operable in three operation modes: an operation mode in which the power level of the transmission output signal S6 is to be high (first mode), medium (third mode), and low (second mode) (see FIG. 2).

(1) First Mode

When the power level of the transmission output signal S6 is high, the first mode is selected by the control section 15 in order to allow the radio frequency power amplifier 5 to operate as a nonlinear amplifier in a saturation operation range or a switching operation range. In the first mode, the first and second switching sections 3 and 8 each select "terminal b", and the third and fourth switching sections 9 and 14 each select "terminal a". To the multiplier 2, an average output level specifying signal SL in accordance with the first mode is output.

The baseband amplitude modulation signal S2 separated by the amplitude/phase separation section 1 is multiplied by the average output level specifying signal SL by the multiplier 2. The resultant multiplication product signal is output to the amplitude modulation signal amplifier 4 via the first switching section 3. The amplitude modulation signal amplifier 4 amplifies the input multiplication product signal and outputs the resultant signal to the radio frequency power amplifier 5 as a supply voltage. The radio frequency power amplifier 5 uses the supply voltage to perform amplitude modulation on the input phase modulated signal S4. In order to generate the supply voltage to be given to the radio frequency power amplifier 5 in accordance with the level of the baseband amplitude modulation signal S2 at a high efficiency, it is desirable to use a class D amplifier, which represents amplitude information with a pulse width, as the amplitude modulation signal amplifier 4.

Meanwhile, the baseband phase modulation signal S3 separated by the amplitude/phase separation section 1 is used for performing phase modulation on the carrier wave signal by the frequency synthesizer 6. The radio frequency phase modulated signal S4 generated by the phase modulation is output to the variable gain amplifier 7. The variable gain amplifier 7 amplifies (or attenuates) the radio frequency phase modulated signal S4 based on the gain control signal S5. The gain control signal S5 is a fixed DC voltage signal SV supplied via the second switching section 8. Therefore, the signal which is output from the variable gain amplifier 7 is a constant envelope signal, which is a phase modulated signal with no fluctuation component in the amplitude direction. The constant envelope signal passes through the third switching section 9 and is processed with amplitude modulation by the radio frequency power amplifier 5 under the supply voltage. Then, the resultant signal passes through the fourth switching section 14 and is output as the transmission output signal S6.

Figures 2, 3:
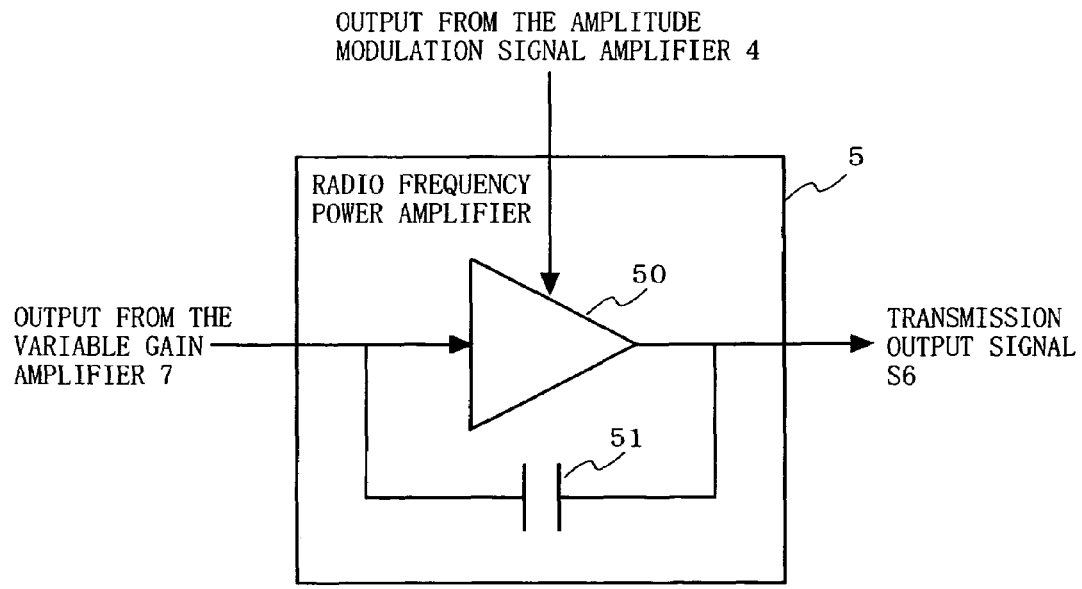
[FIG. 2]
[FIG. 3]
Figure 4:
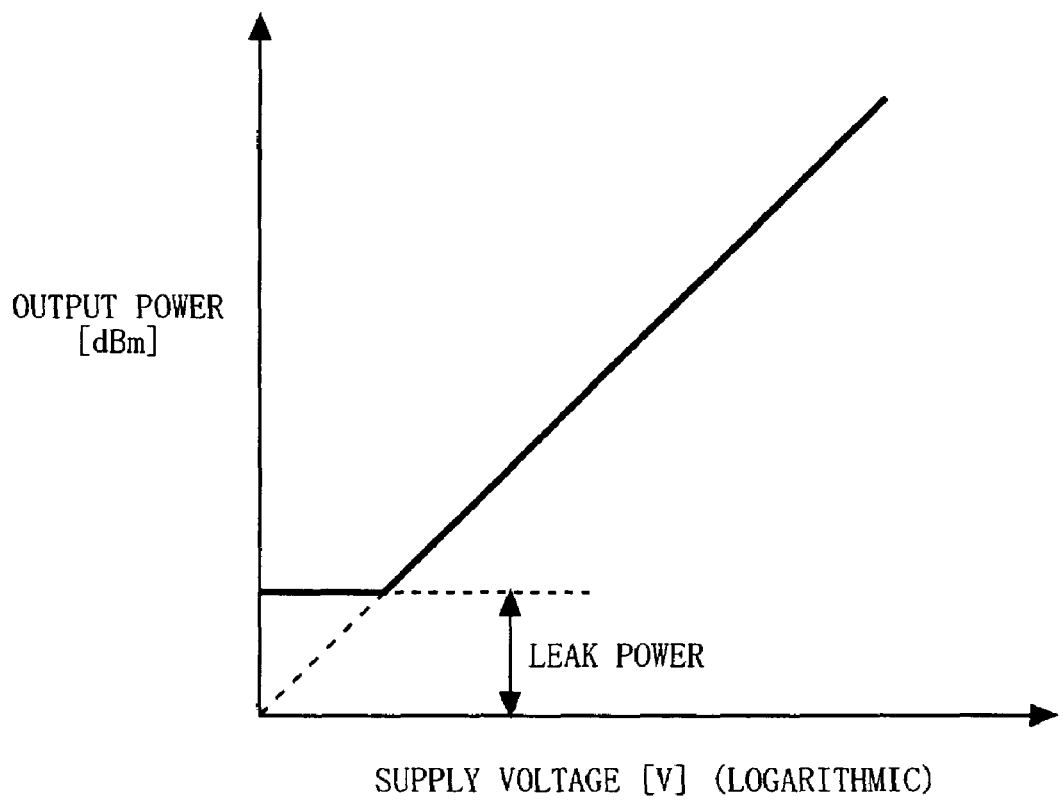
[FIG. 4]

FIG. 3 and FIG. 4 respectively illustrate a circuit configuration and an operation of the radio frequency power amplifier 5 used as a nonlinear amplifier. As shown in FIG. 3, the radio frequency power amplifier 5 can be considered as a nonlinear amplifier 50 having a parasitic capacitance 51 connected between the input and output. It is understood that in the nonlinear amplifier 50, where the supply voltage exceeds a predetermined value, the square of the supply voltage is in proportion to the output power (the horizontal axis is a logarithmic axis). It is understood from FIG. 3 and FIG. 4 that the magnitude of the leak current is defined by the level of a parasitic capacitance 51 and the level of an input signal to the nonlinear amplifier 50 (the level of the output signal from the variable gain amplifier 7).

Without the variable gain amplifier 7, the following occurs. The output from the frequency synthesizer 6 is generally constant and so the magnitude of the leak power is also constant. Thus, the level of the transmission output signal S6 can be reduced by reducing the value of the supply voltage of the nonlinear amplifier 50. However, the value of the supply voltage of the nonlinear amplifier 50 cannot be reduced to less than a predetermined value by the restriction by the leak power.

By contrast, in the first embodiment, the gain of the variable gain amplifier 7 is controlled by the gain control signal S5, and thus the level of the phase modulated signal S4 which is input to the radio frequency power amplifier 5 is controlled. This makes it possible to reduce the leak power. As a result, the range in which the output power is controlled by the supply voltage (dynamic range) in the radio frequency power amplifier 5 can be broadened.

(2) Second Mode

When the power level of the transmission output signal S6 is to be low, the second mode is selected by the control section 15 in order to allow the radio frequency power amplifier 5 to operate as a linear amplifier in a non-saturation operation range. In the second mode, the first and second switching sections 3 and 8 each select "terminal a", and the third and fourth switching sections 9 and 14 each select "terminal b". To the multiplier 2, an average output level specifying signal SL in accordance with the second mode is output.

The baseband phase modulation signal S3 separated by the amplitude/phase separation section 1 is used for performing phase modulation on the carrier wave signal by the frequency synthesizer 6. The radio frequency phase modulated signal S4 generated by the phase modulation is output to the variable gain amplifier 7. The baseband amplitude modulation signal S2 separated by the amplitude/phase separation section 1 is multiplied by the average output level specifying signal SL by the multiplier 2. The resultant multiplication product signal, i.e., a signal having an envelope component (amplitude signal) in proportion to a multiplication product value of the baseband amplitude modulation signal S2 and the average output level specifying signal SL, passes through the second switching section 8 and is output to the variable gain amplifier 7 as the gain control signal S5. The variable gain amplifier 7 performs amplitude modulation on the radio frequency phase modulated signal S4 based on the gain control signal S5. The signal processed with the amplitude modulation by the variable gain amplifier 7 passes through the third and fourth switching sections 9 and 14 and is output as the transmission output signal S6 without passing through the radio frequency power amplifier 5.

In the second mode, the radio frequency power amplifier 5 does not perform amplification. Thus, no power is supplied from the amplitude modulation signal amplifier 4 to the radio frequency power amplifier 5, so that the power consumption is suppressed. As a result, the transmission output signal S6, especially the one having a low power level, can be output while the power consumption is significantly reduced. A transmission device having a wide output power control range down to a low level can be provided. The power consumption can be suppressed by, for example, giving a 0 V DC voltage signal SV to the amplitude modulation signal amplifier 4 via the first switching section 3, or by making the amplitude modulation signal amplifier 4 and the radio frequency power amplifier 5 non-conductive to each other by a fifth switching section (not shown) provided therebetween.

(3) Third Mode

When the power level of the transmission output signal S6 is to have a medium level, the third mode is selected by the control section 15. In the third mode, the first through fourth switching sections 3, 8, 9 and 14 each select "terminal a". To the multiplier 2, an average output level specifying signal SL in accordance with the third mode is output. In the third mode, the radio frequency power amplifier 5 operates as a linear amplifier in which the input and the output have a linear relationship.

The baseband amplitude modulation signal S2 separated by the amplitude/phase separation section 1 is multiplied by the average output level specifying signal SL by the multiplier 2. The resultant multiplication product signal passes through the second switching section 8 and is output to the variable gain amplifier 7 as the gain control signal S5. The amplitude modulation signal amplifier 4 receives a DC voltage signal SV which is input thereto via the first switching section 3, and outputs a constant supply voltage to the radio frequency power amplifier 5.

Meanwhile, the baseband phase modulation signal S3 separated by the amplitude/phase separation section 1 is used for performing phase modulation on the carrier wave signal by the frequency synthesizer 6. The radio frequency phase modulated signal S4 generated by the phase modulation is output to the variable gain amplifier 7. The variable gain amplifier 7 performs amplitude modulation on the radio frequency phase modulated signal S4 based on the gain control signal S5.

When the power level of the transmission output signal S6 is to have a medium level, the operation of the radio frequency power amplifier 5 may go outside the nonlinear operation range. Namely, the linearity of the output power with respect to a change in the supply voltage may be deteriorated. Even in such a case, in the third mode, the linearity of the output signal with respect to the input signal can be maintained and the control range on the output power level can be broadened, because the radio frequency power amplifier 5 is operated as a linear amplifier in the third mode.

As described above, the transmission device according to the first embodiment of the present invention selects the optimum operation mode from a plurality of operation modes in accordance with the output power level of the radio frequency power amplifier 5, and optimally controls the leak from the input to the output of the radio frequency power amplifier 5. Thus, the power amplification can be performed with a high power efficiency and a high linearity, and the transmission output power can be controlled in a wider range from a high level to a low level.

In the first embodiment, in the first mode, the gain control signal S5 supplied to the variable gain amplifier 7 is a fixed DC voltage signal SV. Alternatively, the gain control signal S5 may be varied in accordance with the amplitude modulation signal as in the second and third modes by allowing the radio frequency power amplifier 5 to operate as a nonlinear amplifier, so that the input to the radio frequency power amplifier 5 is varied in accordance with the instantaneous output power. In this case also, the same effect is provided.

In the case where the variable gain amplifier 7 is of a type which nonlinearly varies in accordance with the gain control signal S5 (for example, having an exponential input/output characteristic), an element (not shown) having a function of correcting the nonlinear characteristic into a linear characteristic is inserted before or after the variable gain amplifier 7.

Alternatively, an attenuator may be inserted into a transmission path in which the third and fourth switching sections 9 and 14 select terminal b as in the case of the second mode for a low output power level. Owing to the structure with the attenuator, the level of the transmission output signal can be further attenuated and an output signal having a very low level can be transmitted. Thus, the transmission power can be controlled in a still wider range.

An amplifier equivalent to the amplitude modulation signal amplifier 4 may be inserted between an output terminal c of the second switching section 8 and the variable gain amplifier 7, i.e., on a path in which the gain control signal S5 flows.

The delay difference between the amplitude path and the phase path is different in the first mode (in which the radio frequency power amplifier 5 performs amplitude modulation) from the second and third modes (in which the variable gain amplifier 7 performs amplitude modulation). A functional block for correcting the delay difference is appropriately added when necessary (not shown).

Second Embodiment

Among the above-described three operation modes, the path of the radio frequency transmission signal is different. Therefore, the gain and the phase characteristic of the path is also different among the three operation modes. For this reason, the amplitude and the phase of the transmission output signal drastically change when the operation mode is switched. For example, when the third mode is switched to the second mode, the following occurs. In the third mode, the radio frequency transmission signal passes the radio frequency power amplifier 5; whereas in the second mode, the radio frequency transmission signal does not pass the radio frequency power amplifier 5 (passes through the transmission path from the terminal b of the third switching section 9 to the terminal b of the fourth switching section 14). Because of the characteristic difference between the two paths, the amplitude and the phase of the transmission output signal drastically change.

In a second embodiment, the amplitude and the phase of the transmission output signal are corrected such that the drastic change of the signal does not occur (such that the continuity of the signal is guaranteed) when the operation mode is switched. The amplitude and the phase of the transmission output signal are corrected also such that the continuity of the reference phase and the ACLR characteristic fulfill the standards of the 3GPP (3rd Generation Partnership Project). The correction on the amplitude and the phase of the transmission output signal described in the second embodiment is performed in parallel to the well-known distortion compensation (see patent document 3) which is indispensable to the polar modulation system.

Figure 5:
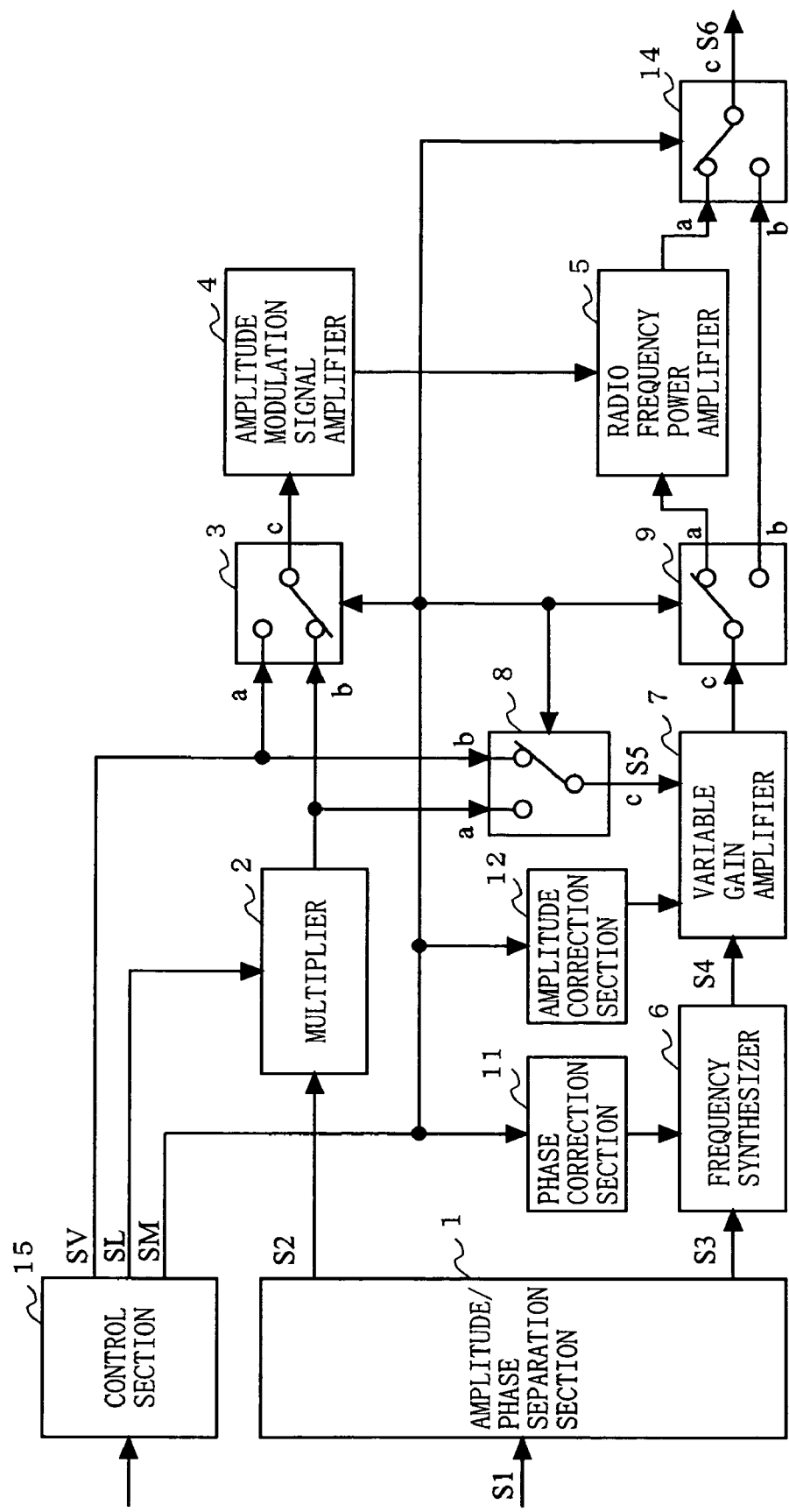
[FIG. 5]

FIG. 5 is a block diagram showing a schematic structure of a transmission device using a polar modulation system according to the second embodiment of the present invention. As shown in FIG. 5, the transmission device according to the second embodiment includes an amplitude/phase separation section 1, a multiplier 2, an amplitude modulation signal amplifier 4, a radio frequency power amplifier 5, a frequency synthesizer 6, a variable gain amplifier 7, a phase correction section 11, an amplitude correction section 12, a control section 15, and first through fourth switching sections 3, 8, 9 and 14. As shown in FIG. 5, the transmission device according to the second embodiment includes the phase correction section 11 and the amplitude correction section 12 in addition to the elements of the transmission device according to the first embodiment.

Hereinafter, the transmission device according to the second embodiment will be described mainly regarding the phase correction section 11 and the amplitude correction section 12.

The phase correction section 11 stores phase correction information for correcting the phase of the baseband phase modulation signal S3 by the frequency synthesizer 6, in correspondence with each operation mode. The amplitude correction section 12 stores amplitude correction information for correcting the amplitude of the radio frequency phase modulated signal S4 by the variable gain amplifier 7, in correspondence with each operation mode. The phase correction information and the amplitude correction information may be stored in a table form.

Figure 6:
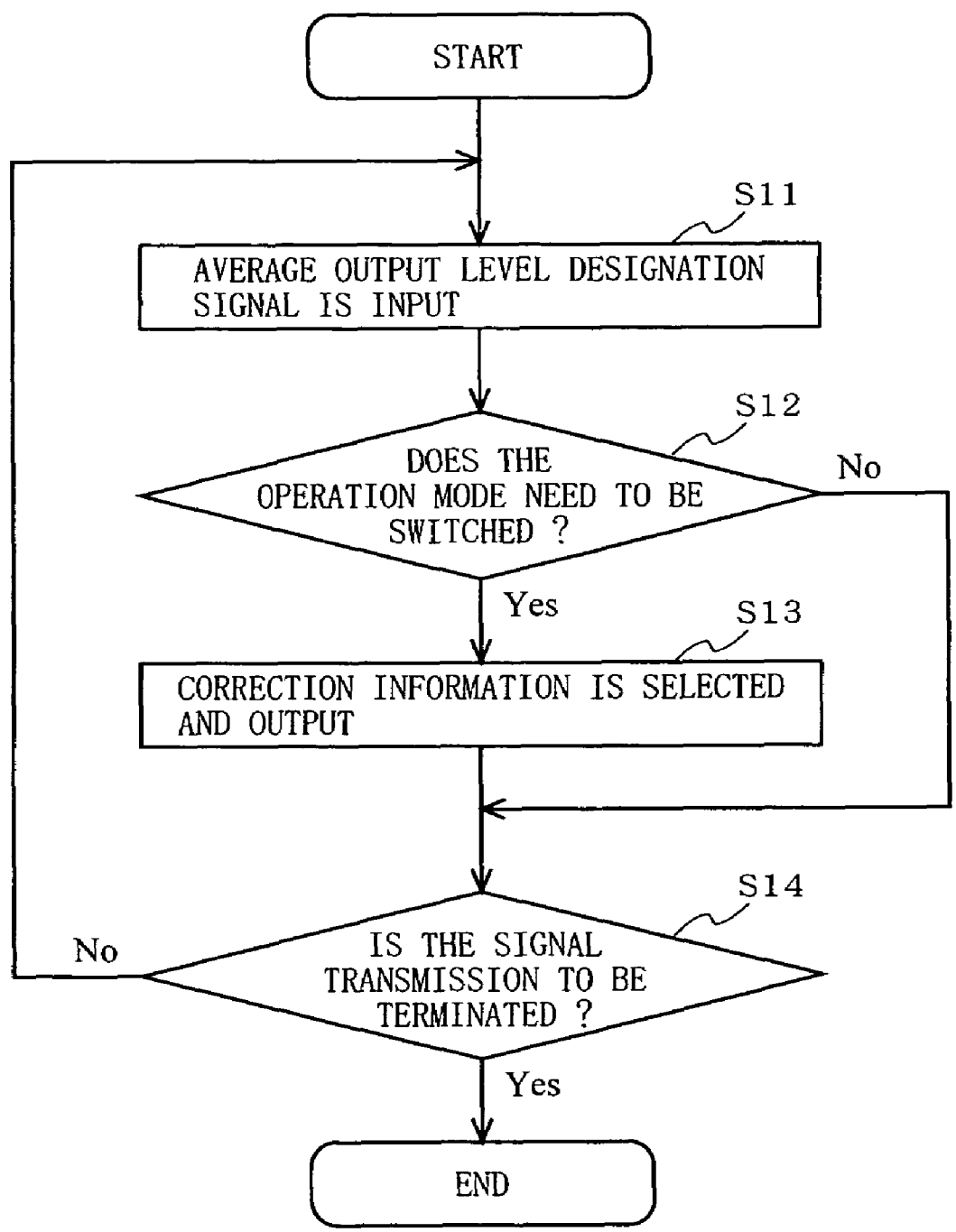
[FIG. 6]

FIG. 6 is a flowchart illustrating a method by which the transmission device according to the second embodiment switches the operation mode among the three modes (FIG. 2) described in the first embodiment.

When the polar modulation transmission processing is started, the average output level specifying signal SL is input to the control section 15 (step S11). Next, the control section 15 checks the average output level specifying signal SL to determine whether or not the operation mode needs to be switched (step S12). The switching point of the operation mode is not determined only by the value of the average output level, but by whether the average output level is increased or decreased. Namely, the switching point of the operation mode has hysteresis.

Figure 7:
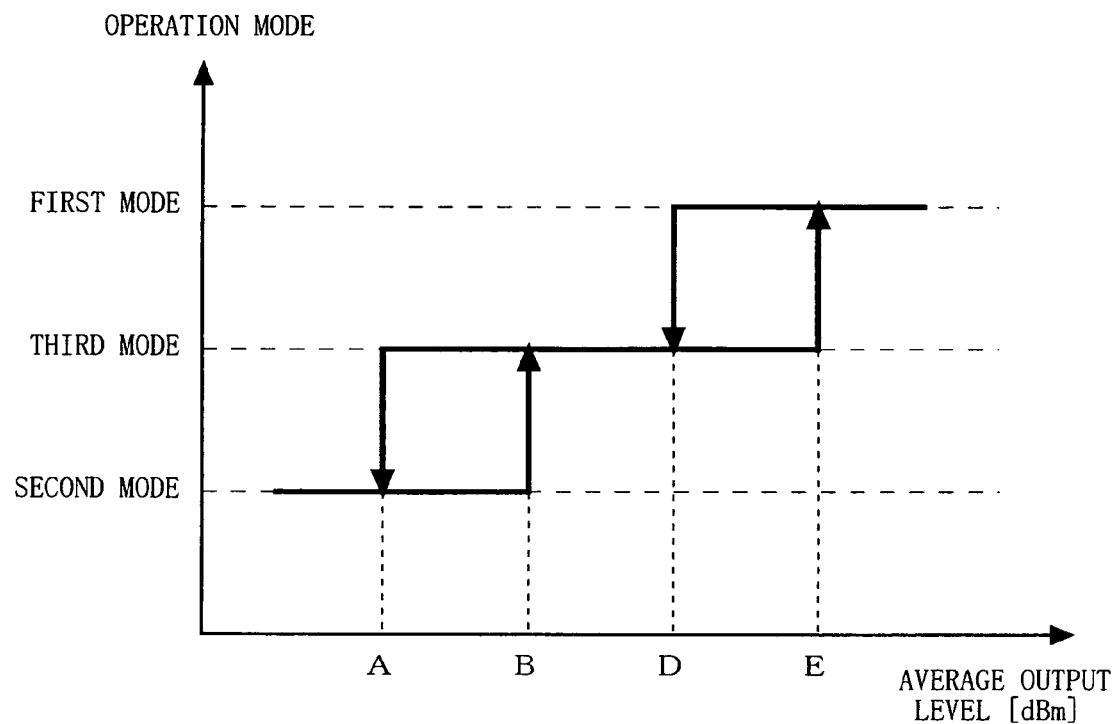
[FIG. 7]

FIG. 7 illustrates the hysteresis characteristic during the operation mode is transferred from the second mode to the third mode and to the first mode. When the average output level is changed from a low output level to a medium output level, the operation mode is transferred from the second mode to the third mode at point B in FIG. 7. By contrast, when the average output level is changed from a medium output level to a low output level, the operation mode is transferred from the third mode to the second mode at point A in FIG. 7. By providing such a hysteresis characteristic, even when the average output level is frequently changed around the switching point of the operation mode, the number of times that the operation mode is switched can be minimized so that the continuity of the amplitude and the phase can be realized with a higher certainty. This is also true when the operation mode is transferred from the third mode to the first mode (point D and point E).

When it is determined in step S12 that the operation mode needs to be switched, the control section 15 outputs a mode switching signal SM to the phase correction section 11 and the amplitude correction section 12. The phase correction section 11 selects the phase correction information corresponding to the mode switching signal SM, and outputs the selected phase correction information to the frequency synthesizer 6 (step S13). The amplitude correction section 12 selects the amplitude correction information corresponding to the mode switching signal SM, and outputs the selected amplitude correction information to the variable gain amplifier 7 (step S13). The frequency synthesizer 6 and the variable gain amplifier 7 use such correction information to execute a processing operation.

Figure 8A:
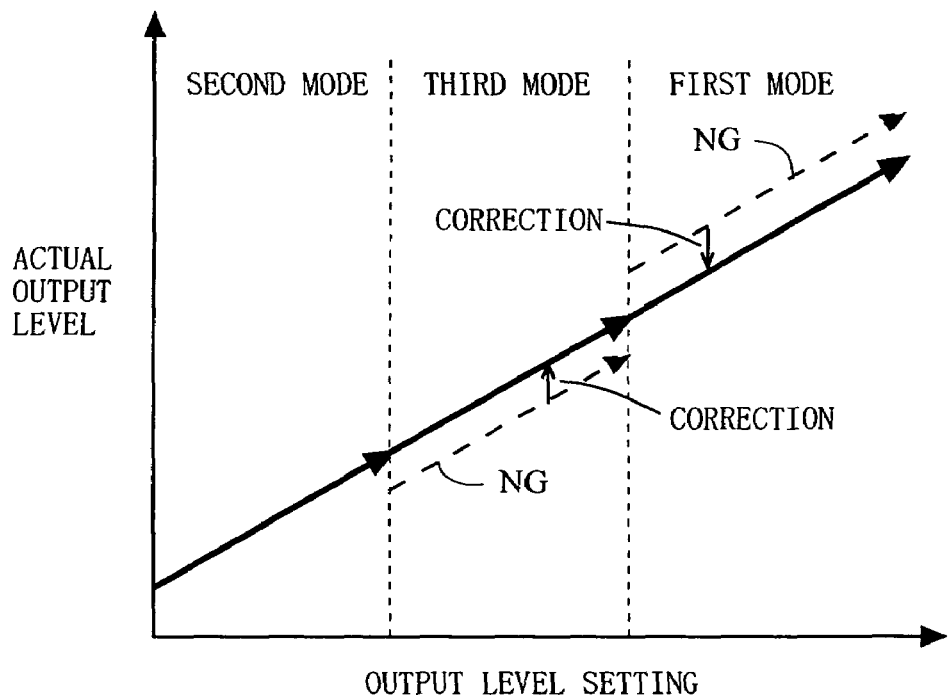
[FIG. 8A]
Figure 8B:
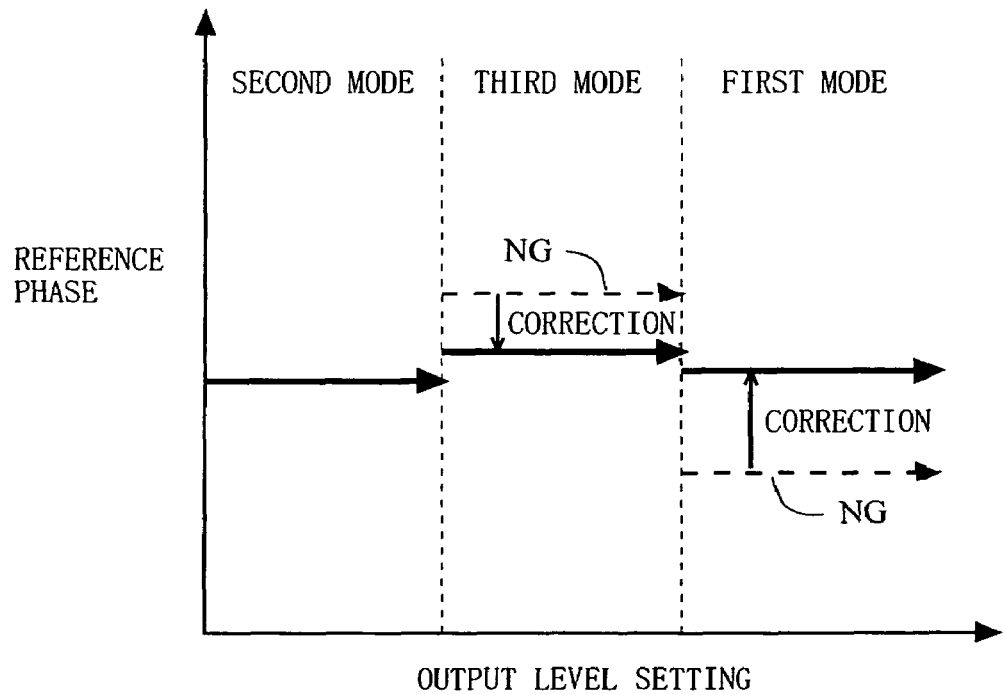
[FIG. 8B]

Owing to the processing operation using the correction information, the amplitude and the phase can be continuously changed without being drastically changed between before and after the switching of the operation mode. FIG. 8A and FIG. 8B respectively illustrate a continuous change of the amplitude and the phase of the transmission output signal, which is realized by the transmission device according to the present invention.

When the mode switching processing in step S13 is completed, or when it is determined in step S12 that the operation mode does not need to be switched, it is determined whether or not to terminate the transmission (step S14). When the transmission is not to be terminated, the processing returns to step S11 at the start of the next signal transmission and the loop of steps S12 through S14 is repeated.

As described above, the transmission device according to the second embodiment of the present invention selects the optimum operation mode from a plurality of operation modes in accordance with the output power level of the radio frequency power amplifier 5, and optimally controls the leak from the input to the output of the radio frequency power amplifier 5. Thus, the power amplification can be performed with a high power efficiency and a high linearity, and the transmission output power can be controlled in a wide range from a high level to a low level. In addition, the discontinuous change in the amplitude and the phase of the output signal which accompanies the switching of the operation mode is prevented, and thus the amplitude and the phase are changed continuously. Therefore, problems including transitional spectrum expansion accompanying the switching can be suppressed.

In the second embodiment, the phase correction section 11 and the amplitude correction section 12 respectively output the phase correction information and the amplitude correction information to the frequency synthesizer 6 and the variable gain amplifier 7. In the case where the control section 15 has the phase correction information and the amplitude correction information, the control section 15 may directly control the frequency synthesizer 6 and the variable gain amplifier 7. Alternatively, the transmission output signal S6 from the radio frequency power amplifier 5 may be detected, and the detection result may be fed back to the control section 15. In this case, the continuity of the amplitude and the phase of the transmission output signal Sb can be realized more accurately.

Figure 9A:
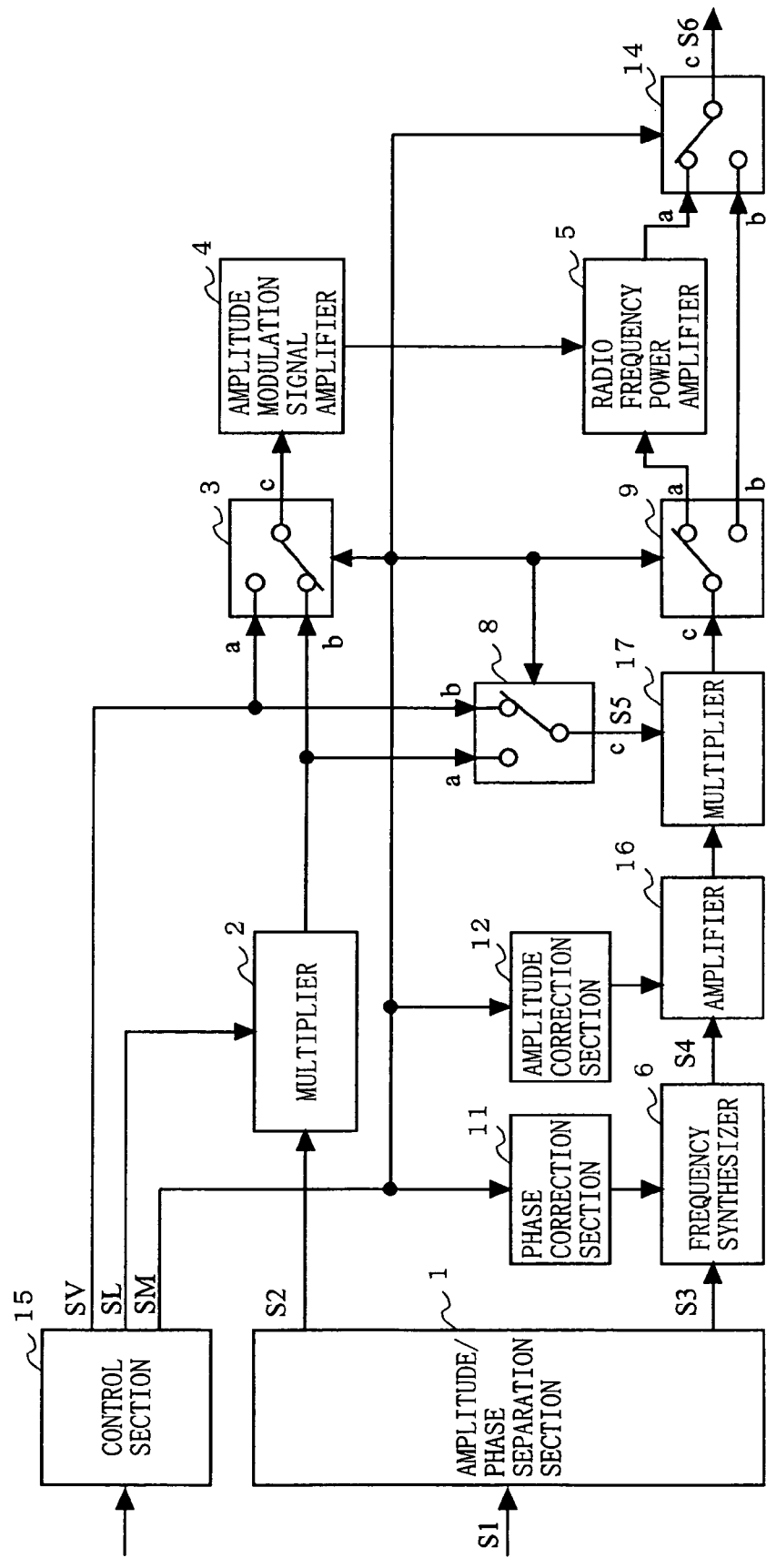
[FIG. 9A]
Figure 9B:
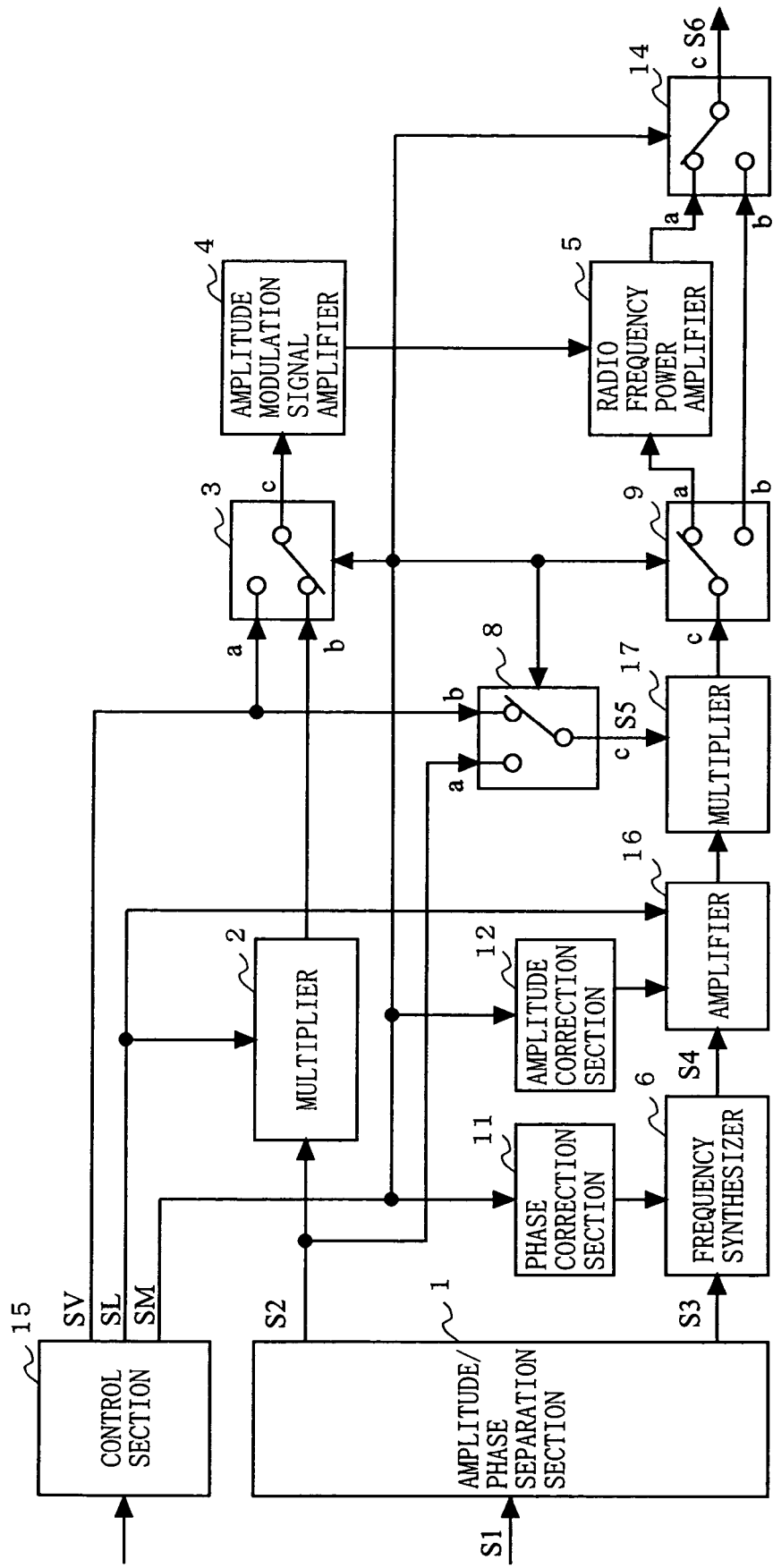
[FIG. 9B]

As shown in FIG. 9A, the variable gain amplifier 7 described in the second embodiment may be provided as an amplifier 16 and a multiplier 17. In this case, the gain control signal S5 which is output from the second switching section 8 is input to the multiplier 17. As shown in FIG. 9B, the baseband amplitude modulation signal S2 may be directly input to the terminal a of the second switching section 8, instead of the multiplication product of the baseband amplitude modulation signal S2 and the average output level specifying signal SL. In this structure, in the second mode and the third mode, the amplifier 16 controls the average output level based on the amplitude correction information, and the multiplier 17 performs amplitude modulation. By allowing the multiplier 17 to perform amplitude modulation, the envelope of the output signal can be linearly changed with respect to the amplitude signal.

The average output level can be controlled in various manners as described below. For example, in the case where the average output level is controlled by the output from the second switching section 8, the multiplication product of the average output level specifying signal SL and the baseband amplitude modulation signal S2 may be input to the multiplier 17 as an input signal S5. In the case where the average output level is controlled on a stage after the multiplier 17, an additional variable gain amplifier may be provided. In the case where the radio frequency power amplifier 5 performs amplitude modulation, the terminal b of the second switching section 8 may be selected, so that the DC voltage signal SV applied to the terminal b is output to the multiplier 17.

In the first and second embodiments, the transmission device includes the multiplier 2. The multiplier 2 may be omitted as long as the baseband amplitude modulation signal S2 processed with average output level control based on the average output level specifying signal SL is output from the amplitude/phase separation section 1.

Figure 10:
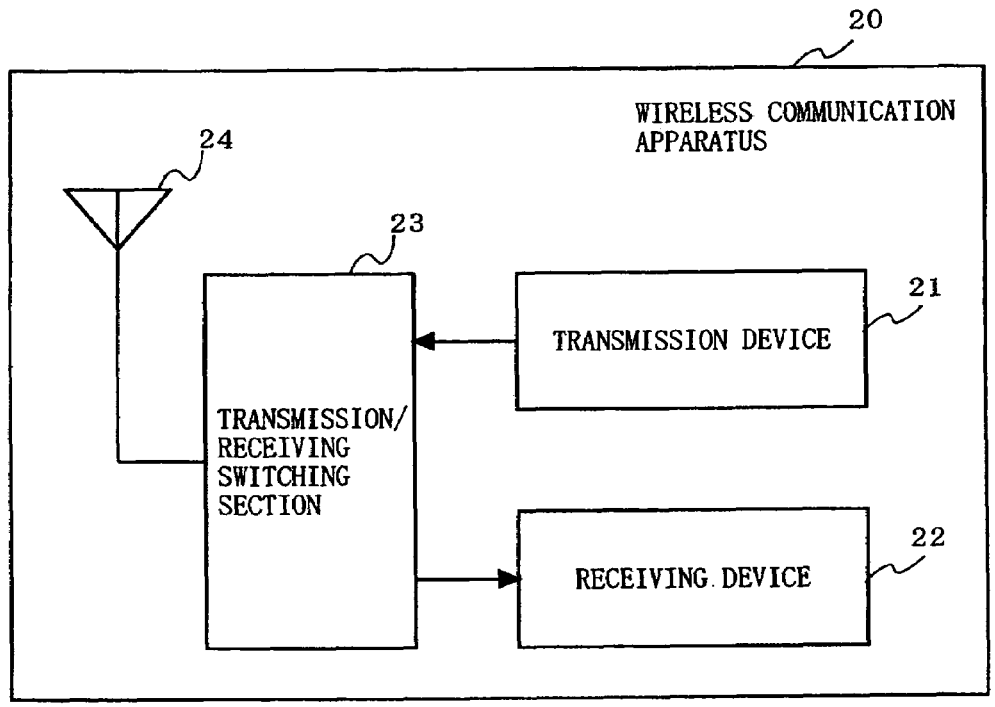
[FIG. 10]
Figure 11:
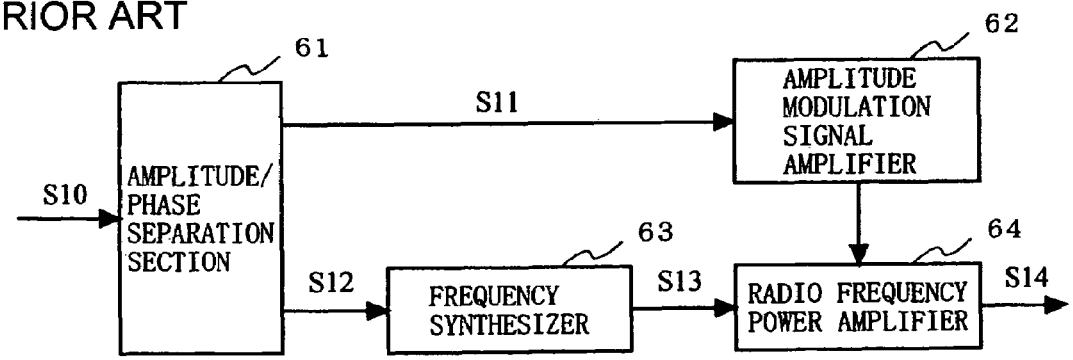
[FIG. 11]

Embodiment of a Wireles Communication Apparatus Including the Transmission Device According to the Present Invention FIG. 10 is a block diagram showing a schematic structure of a wireless communication apparatus 20 including a transmission device according to the first or the second embodiment described above. As shown in FIG. 10, the wireless communication apparatus 20 includes a transmission device 21 and a receiving device 22. The transmission device 21 and the receiving device 22 are connected to an antenna 24 via a transmission/receiving switching section 23. As the transmission device 21, the transmission device according to the first or the second embodiment is used. The wireless communication apparatus 20 is, for example, a mobile wireless communication terminal such as a mobile phone, a mobile information terminal having a dialog function or the like, or a wireless base station.

With the wireless communication apparatus 20, at the time of transmission, the transmission device 21 releases the transmission output signal S6 from the antenna 24 via the transmission/receiving switching section 23. At the time of receiving, the receiving device 22 receives an input receiving signal from the antenna 24 via the transmission/receiving switching section 23 and demodulates the input receiving signal. When the output power level is to be high, the radio frequency power amplifier in the transmission device 21 operates as a nonlinear amplifier, which improves the power efficiency. With a mobile wireless terminal apparatus or the like, the battery consumption rate is lowered and thus the battery life can be extended. The radio frequency power amplifier can be reduced in size and also can reduce the amount of heat generation, by the improvement in the power efficiency. This allows a wireless communication apparatus including this radio frequency power amplifier to be reduced in size. When the output power level is to be low, the radio frequency power amplifier can be used as a linear amplifier, or the signal is allowed to pass through a transmission path or an attenuator without using the radio frequency power amplifier. In this way, the output level range can be broadened to encompass a lower level.

A transmission device according to the present invention, when applied to a base station apparatus of a wireless system including a plurality of high power transmission apparatuses, improves the power efficiency when the output power level is to be high. This can reduce the size of the radio frequency power amplifier, the amount of heat generation, and the size of various types of equipment, and can improve the space efficiency.

INDUSTRIAL APPLICABILITY

The present invention is applicable to a mobile terminal apparatus such as, for example, a mobile phone or a mobile information terminal and to a wireless communication apparatus such as, for example, a wireless base station; and is especially useful for, for example, controlling the transmission output power over a wide range with a high power efficiency.

The invention claimed is:

1. A transmission device using polar modulation, comprising:
   an amplitude/phase separation section for separating an input baseband modulation signal into a baseband amplitude modulation signal and a baseband phase modulation signal;
   a frequency synthesizer for performing phase modulation on a radio frequency carrier signal with the baseband phase modulation signal to generate a radio frequency phase modulated signal;
   a multiplier for multiplying the baseband amplitude modulation signal by a predetermined value;
   a first switching section and a second switching section for allowing the baseband amplitude modulation signal, obtained as a result of the multiplication and output from the multiplier, and a predetermined DC voltage signal to be input thereto, and selecting and outputting one of the signals;
   an amplitude modulation signal amplifier for supplying a supply voltage based on the signal which is output from the first switching section;
   a variable gain amplifier for amplifying the radio frequency phase modulated signal generated by the frequency synthesizer in accordance with the signal which is output from the second switching section;
   a radio frequency power amplifier for performing power amplification on the radio frequency phase modulated signal amplified by the variable gain amplifier, using the supply voltage supplied from the amplitude modulation signal amplifier; and
   a third switching section and a fourth switching section, respectively provided before and after the radio frequency power amplifier, for selecting either to output the radio frequency phase modulated signal amplified by the variable gain amplifier via the radio frequency power amplifier or to output the radio frequency phase modulated signal without using the radio frequency power amplifier;
   wherein the switching operation of the first through fourth switching sections is controlled in accordance with a power level of a signal which is to be output from the fourth switching section.

2. A transmission device according to claim 1, wherein:
   in a first mode in which the power level of the signal which is output from the fourth switching section is to be higher than a first predetermined value, the first switching section selects the multiplied baseband amplitude modulation signal, the second switching section selects the DC voltage signal, and the third and fourth switching sections select a path for outputting the radio frequency phase modulated signal via the radio frequency power amplifier; and
   in a second mode in which the power level of the signal which is output from the fourth switching section is to be lower than a second predetermined value, the first switching section selects the DC voltage signal, the second switching section selects the multiplied baseband amplitude modulation signal, and the third and fourth switching sections select a path for outputting the radio frequency phase modulated signal without using the radio frequency power amplifier.

3. A transmission device according to claim 2, wherein:
   in a third mode in which the power level of the signal which is output from the fourth switching section is to be equal to or lower than the first predetermined value and equal to or higher than the second predetermined value, the first switching section selects the DC voltage signal, the second switching section selects the multiplied baseband amplitude modulation signal, and the third and fourth switching sections select a path for outputting the radio frequency phase modulated signal via the radio frequency power amplifier.

4. A transmission device according to claim 2, wherein the variable gain amplifier comprises:
   an amplifier for amplifying the radio frequency phase modulated signal generated by the frequency synthesizer; and
   a multiplier for multiplying the radio frequency phase modulated signal amplified by the amplifier, by the signal which is output from the second switching section.

5. A transmission device according to claim 3, wherein the variable gain amplifier comprises:
   an amplifier for amplifying the radio frequency phase modulated signal generated by the frequency synthesizer; and
   a multiplier for multiplying the radio frequency phase modulated signal amplified by the amplifier, by the signal which is output from the second switching section.

6. A transmission device according to claim 1, further comprising:
   a phase correction section for storing phase correction information, for continuously changing a signal phase at a time of mode switching, for each of a first mode through a third mode; and an amplitude correction section for storing amplitude correction information, for continuously changing a signal amplitude at the time of mode switching, for each of the first through third modes;

wherein:

the frequency synthesizer corrects a phase of the radio frequency phase modulated signal based on the phase correction information; and the variable gain amplifier corrects an amplitude of the radio frequency phase modulated signal based on the amplitude correction information.

7. A transmission device according to claim 1, wherein mode switching is performed with hysteresis.

8. A transmission device according to claim 1, further comprising an attenuator inserted on a path, provided by the third and fourth switching sections, for outputting the radio frequency phase modulated signal without using the radio frequency power amplifier.

9. A wireless communication apparatus for transmitting a transmission signal from an antenna, the wireless communication apparatus comprising a transmission device according to claim 1, wherein the transmission signal is processed with power amplification and is output to the antenna.

10. A wireless communication apparatus for transmitting a transmission signal from an antenna, the wireless communication apparatus comprising a transmission device according to claim 2, wherein the transmission signal is processed with power amplification and is output to the antenna.

11. A wireless communication apparatus for transmitting a transmission signal from an antenna, the wireless communication apparatus comprising a transmission device according to claim 3, wherein the transmission signal is processed with power amplification and is output to the antenna.

12. A wireless communication apparatus for transmitting a transmission signal from an antenna, the wireless communication apparatus comprising a transmission device according to claim 4, wherein the transmission signal is processed with power amplification and is output to the antenna.

13. A wireless communication apparatus for transmitting a transmission signal from an antenna, the wireless communication apparatus comprising a transmission device according to claim 5, wherein the transmission signal is processed with power amplification and is output to the antenna.

14. A wireless communication apparatus for transmitting a transmission signal from an antenna, the wireless communication apparatus comprising a transmission device according to claim 6, wherein the transmission signal is processed with power amplification and is output to the antenna.

15. A wireless communication apparatus for transmitting a transmission signal from an antenna, the wireless communication apparatus comprising a transmission device according to claim 7, wherein the transmission signal is processed with power amplification and is output to the antenna.

16. A wireless communication apparatus for transmitting a transmission signal from an antenna, the wireless communication apparatus comprising a transmission device according to claim 8, wherein the transmission signal is processed with power amplification and is output to the antenna.

\* \* \* \* \*

UNITED STATES PATENT AND TRADEMARK OFFICE
CERTIFICATE OF CORRECTION

PATENT NO. : 7,664,202 B2
APPLICATION NO. : 11/547354
DATED : February 16, 2010
INVENTOR(S) : Yoshihiro Hara et al.

It is certified that error appears in the above-identified patent and that said Letters Patent is hereby corrected as shown below:

On the Cover Page

In section (86) PCT No., please replace "PCT/JP2006/001775" with --PCT/JP2006/301775--.

Signed and Sealed this

Eleventh Day of May, 2010

David J. Kappos
*Director of the United States Patent and Trademark Office*